(12) United States Patent
Hsiao et al.

(10) Patent No.: US 9,202,662 B2
(45) Date of Patent: Dec. 1, 2015

(54) CHARGED PARTICLE LITHOGRAPHY SYSTEM WITH A LONG SHAPE ILLUMINATION BEAM

(71) Applicant: Taiwan Semiconductor Manufacturing Company, Ltd., Hsin-Chu (TW)

(72) Inventors: Jimmy Hsiao, Zhubei (TW); Ming-Zhang Kuo, Xigang Shiang (TW); Ping-Lin Yang, Changhua County (TW); Cheng-Chung Lin, Hsinchu (TW); Osamu Takahashi, Round Rock, TX (US); Sang Hoo Dhong, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 207 days.

(21) Appl. No.: 13/756,178

(22) Filed: Jan. 31, 2013

(65) Prior Publication Data

US 2014/0212815 A1 Jul. 31, 2014

(51) Int. Cl.
| | |
|---|---|
| *G21K 5/04* | (2006.01) |
| *H01J 29/62* | (2006.01) |
| *H01J 3/12* | (2006.01) |
| *H01J 3/16* | (2006.01) |
| *H01J 3/18* | (2006.01) |
| *H01J 37/30* | (2006.01) |
| *H01J 37/317* | (2006.01) |

(52) U.S. Cl.
CPC . *H01J 29/62* (2013.01); *H01J 3/12* (2013.01); *H01J 3/16* (2013.01); *H01J 3/18* (2013.01); *H01J 37/3007* (2013.01); *H01J 37/3177* (2013.01); *H01J 2237/1205* (2013.01); *H01J 2237/31789* (2013.01)

(58) Field of Classification Search
USPC .......... 250/396 R, 398, 492.1, 492.2, 492.22, 250/492.3
See application file for complete search history.

(56) References Cited

U.S. PATENT DOCUMENTS 7,247,866 B2 * 7/2007 Bakker et al. .............. 250/492.1

* cited by examiner

*Primary Examiner* — Nicole Ippolito
*Assistant Examiner* — Hanway Chang
(74) *Attorney, Agent, or Firm* — Haynes and Boone, LLP

(57) ABSTRACT

A system includes an integrated circuit (IC) design data base having a feature, a source configured to generate a radiation beam, a pattern generator (PG) including a mirror array plate and an electrode plate disposed over the mirror array plate, wherein the electrode plate includes a lens let having a first dimension and a second dimension perpendicular to the first dimension with the first dimension larger than the second dimension so that the lens let modifies the radiation beam to form the long shaped radiation beam, and a stage configured secured the substrate. The system further includes an electric field generator connecting the mirror array plate. The mirror array plate includes a mirror. The mirror absorbs or reflects the radiation beam. The radiation beam includes electron beam or ion beam. The second dimension is equal to a minimum dimension of the feature.

20 Claims, 7 Drawing Sheets

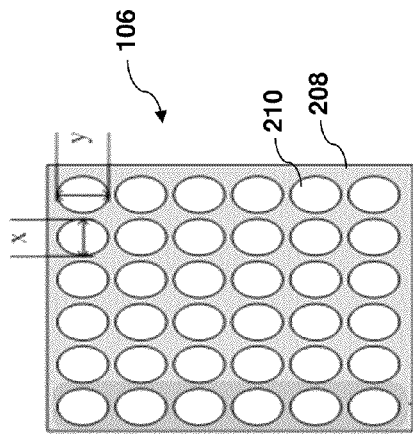
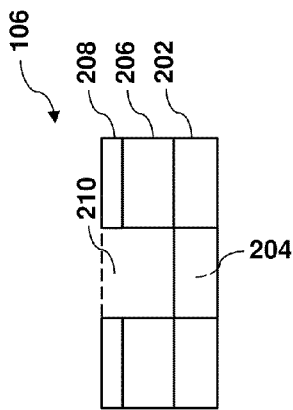
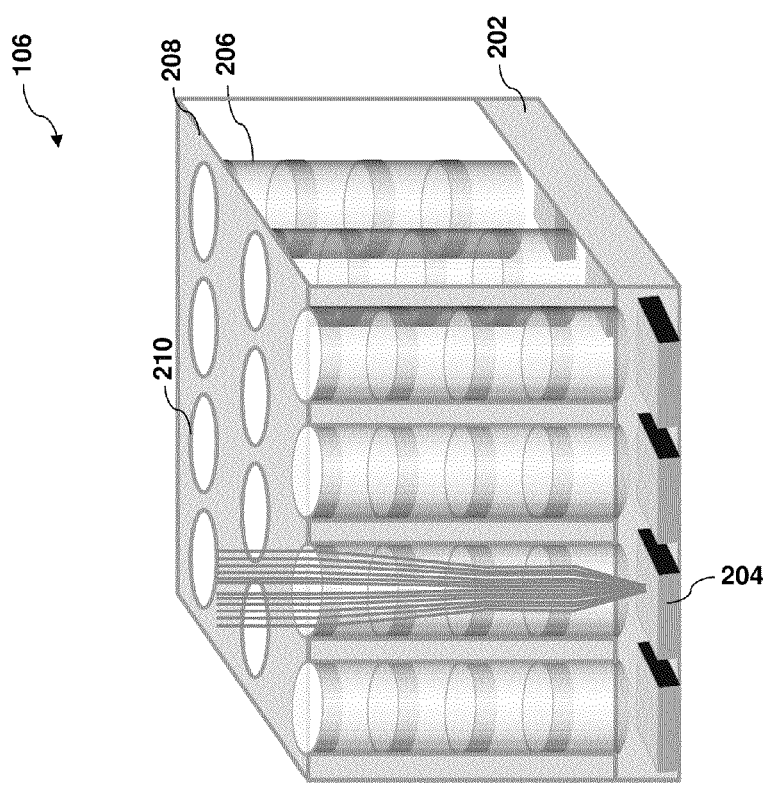

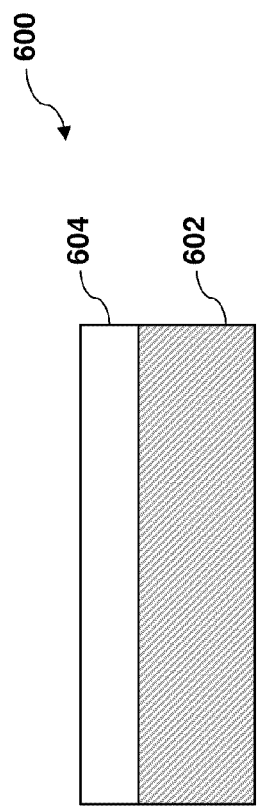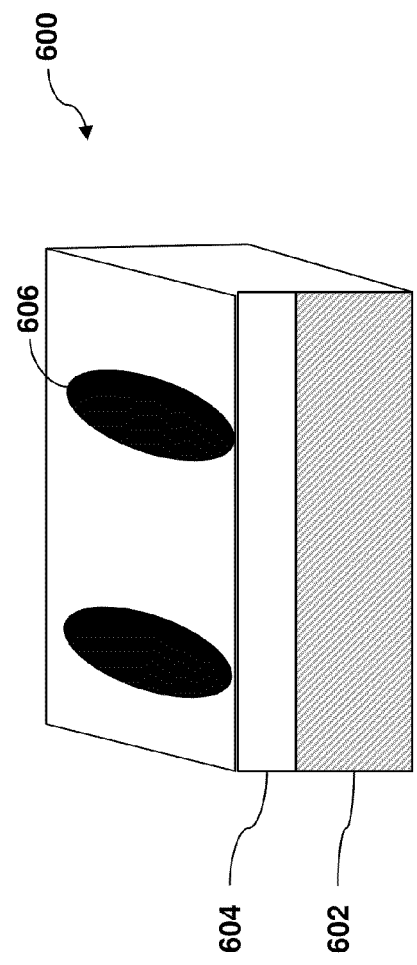

CHARGED PARTICLE LITHOGRAPHY SYSTEM WITH A LONG SHAPE ILLUMINATION BEAM

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Scaling presents difficulties, especially with lithography systems. For example, light diffraction in an optical lithography system becomes an obstacle for further scaling down feature size. Charged particle beam lithography systems can be used, but these systems often suffer from reduced throughput. Accordingly, what is needed is a method to increase wafer throughput in a lithography system, such as a charged particle beam lithography system.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIGS. 2A-C are diagrams and cross sectional views of a structure for implementing one or more embodiments.

FIGS. 6-12 are cross sectional views of forming a feature on a substrate according to one or more embodiments.

DETAILED DESCRIPTION

Figure 1:
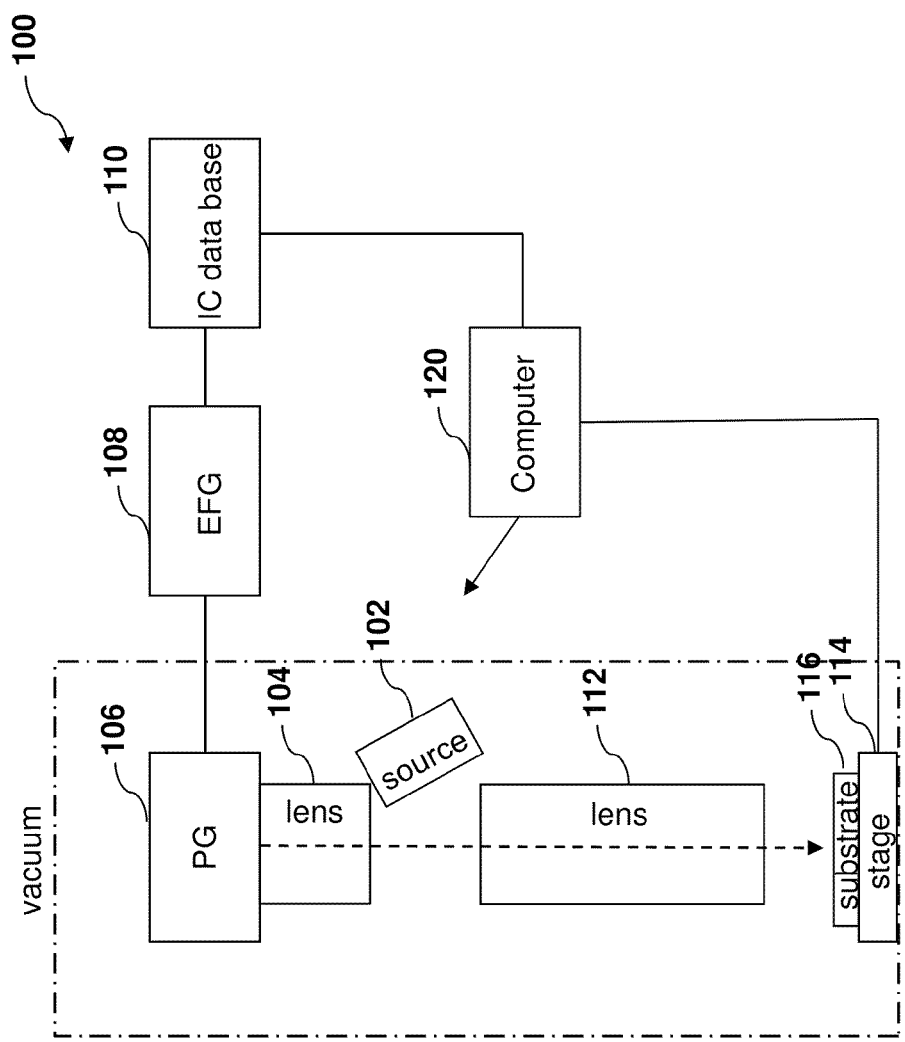
FIG. 1 is a block diagram of lithography system that can benefit from one or more embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring now to FIG. 1, a lithography system 100 is an example of a system that can benefit from one or more embodiments of the present disclosure. The lithography system 100 includes an source 102, a condenser lens 104, a pattern generator (PG) 106, an electric field generator (EFG) 108, an integrated circuit (IC) design data base 110, a projection lens 112, a stage 114, and a substrate 116. In the present embodiments, a lithography system is also referred to as an exposing system.

The source 102 provides a radiation beam, such as an electron beam or an ion beam. The source 102 may include an ion source or an electron source. In some embodiments, the electron source includes a cathode, an anode, and an aperture. The electron source provides a plurality of electron beams emitted from a conducting material by heating the conducting material to a very high temperature, where the electrons have sufficient energy to overcome a work function barrier and escape from the conducting material (thermionic sources), or by applying an electric field (potential) sufficiently strong that the electrons tunnel through the work function barrier (field emission sources). A high electric potential is applied between the cathode and the anode, which accelerates the electrons towards and through the aperture. The value of the applied electric potential determines the energy level of the electron that reaches on a substrate secured on a stage.

The condenser lens 104 focuses the radiation beams from a source and guides the radiation beams to the pattern generator 106. In some embodiments, the radiation beams are parallel to each other after passing through the condenser lens 104. The condenser lens 104 includes a plurality of electromagnetic apertures, electrostatic lenses, and electromagnetic lenses.

The pattern generator 106 is configured to connect to the electric field generator 108 and to the IC design data base 110. In some embodiments, the pattern generator 106 includes a mirror array plate, at least one electrode plate disposed over the mirror array plate, and at least one insulator sandwiched between the mirror array plate and the electrode plate or between the electrode plates. The mirror array plate includes a plurality of mirrors connecting to the electric field generator 108, the electrode plate includes a plurality of lens lets, and the insulator layer includes an insulator. The pattern generator 106 provides the patterned radiation beam according to a design layout by reflecting or absorbing a radiation beam guided to each lens let by the condenser lens 104 and defines shape of the radiation beams according to the shape of the lens. The pattern generator 106 will be discussed in more detail below.

The electric field generator 108 connects to a mirror of a mirror array plate of the pattern generator 106 and the IC design data base 110. In the present embodiments, the electric field generator 108 turns mirrors on or off according to the IC design data base 110. In one embodiment, the radiation beam includes an electron beam.

The IC design database 110 connects to the electric field generator 108. The IC designed IC database 110 includes an IC design layout. In the present embodiments, an IC design layout includes one or more IC design features or patterns. The IC design layout is presented in one or more data files having the information of geometrical patterns. In one example, the IC design layout is expressed in a "gds" format. The IC design database 110 controls the electric field generator 108 according to the IC design layout and therefore controls the pattern generator 106 to provides the patterned radiation beams.

The projection lens 112 includes a plurality of electromagnetic apertures, electrostatic lenses, electromagnetic lenses, and deflectors. The projection lens 112 steers the patterned radiation beams to a substrate in a desired direction perpendicular surface of the substrate.

The stage 110 includes a plurality of motors, roller guides, and tables. The stage 110 secures the substrate 112 by vacuum, and provides accurate position and movement of the substrate 112 in X, Y and Z directions during focus, leveling and exposure operation of a substrate in the electron lithography system 100. The lithography system 100 may include one or more vacuum pumps, such as a mechanical pump for a low vacuum and an ion pump for a high vacuum. The lithography system 100 also includes a computer 120, with a processor, memory and I/O, and other hardware.

Referring to FIGS. 2A-C, a diagram and cross sectional views of the pattern generator 106 for implementing one or more embodiments is illustrated. The pattern generator 106 includes a mirror array plate 202 having a plurality of mirrors 204, at least one insulator layer 206, and at least one electrode plate 208 having a plurality of lens lets 210. It is understood that other configurations and inclusion or omission of various items in the pattern generator 106 may be possible. The pattern generator 106 is an example, and is not intended to limit the present invention beyond what is explicitly recited in the claims.

In the present embodiments, the mirror array plate 202 includes the mirrors 204. The mirrors 204 are connected to the electric field generator 108 which is further connected to the IC design data base 110. The mirror 204 can be turned in an "on" or "off" state for reflecting or absorbing a radiation beam, such as an electron beam, projected on the mirror 204 by the electric field or potential. In one example, the mirror 204 is in "off" state and the radiation beam projected on the mirror 204 is absorbed and no radiation beam is reflected when a first potential is applied to the mirror 204. In another example, the mirror 204 is in "on" state and the radiation beam projected on the mirror 204 is reflected and is guided to the substrate 112 when a second potential is applied. Therefore, by turning on or off the mirrors 204 based on an IC design layout, a patterned radiation beam is generated.

In the present embodiments, the electrode plate 208 is disposed over the mirror array plate 202 and the insulator layer 206 is sandwiched by the mirror array plate 202 and the electrode plate 208. The electrode 208 includes a metal or a metal alloy. The electrode plate 208 includes the lens let 210. The lens let 210 formed on the electrode plate 208 is aligned to a corresponding mirror 204 formed on the mirror array 202. The electrode plate 208 is also connected to a source of an electric field and thereby guides the radiation beam passing through the lens let 210. A shape of the radiation beam projected to the substrate can be defined, at least in part, by the shape of the lens let 210, which will be discussed in more detail below. The insulator layer 206 includes an insulator, such as, air, polymer, or other suitable material.

In some embodiments, the mirrors 204 are connected to the electric field generator 108. By selectively turning on or off the mirrors 204 according to an IC design layout, the radiation beams selectively reflected by the mirror 204 becomes the patterned radiation beams, transfers the IC layout or feature to a resist deposited on the substrate, and forms a resist pattern on the substrate by an exposing and developing process.

For example, when the substrate 116 deposited with a resist film is loaded into the lithography system 100 for exposing the resist film as shown in FIG. 1, the radiation beams, such as the electron beams, generated from the source 102 are projected to the pattern generator 106 through the condense lens 104. Selected electron beams are absorbed or reflected by the pattern generator 106 controlled by the electric potential 108 according to the IC design data base 110 to form the patterned radiation beams. The patterned radiation beams are projected on a resist film deposited on the substrate 116 secured by the stage 114, and the resist film deposited on the substrate 116 is exposed by the patterned radiation beam. After a developing process, a resist pattern according to the IC design layout is formed on the substrate 116.

In some embodiments, the electrode plate 208 includes a plurality of the lens lets 210 as shown in FIG. 2C. Each lens let 208 includes a first dimension y, or height and a second dimension x, or width, as shown in the figure. In one embodiment, the lens let 208 has a first dimension y larger than a second dimension x, such as a rectangle, an oval, or an eclipse circle.

According to one or more embodiments, the lens lets 210 having the first dimension y larger than the second dimension x can increase throughput of the system 100. In one embodiment, in an IC design data base or layout, a minimum feature is a gate of a transistor, and if the second dimension x is defined by the minimum feature (e.g. a gate), the lithography system 100 can write or expose more area using the same amount of electron beams having the first dimension y larger than the second dimension x.

Figures 3A, 3B:
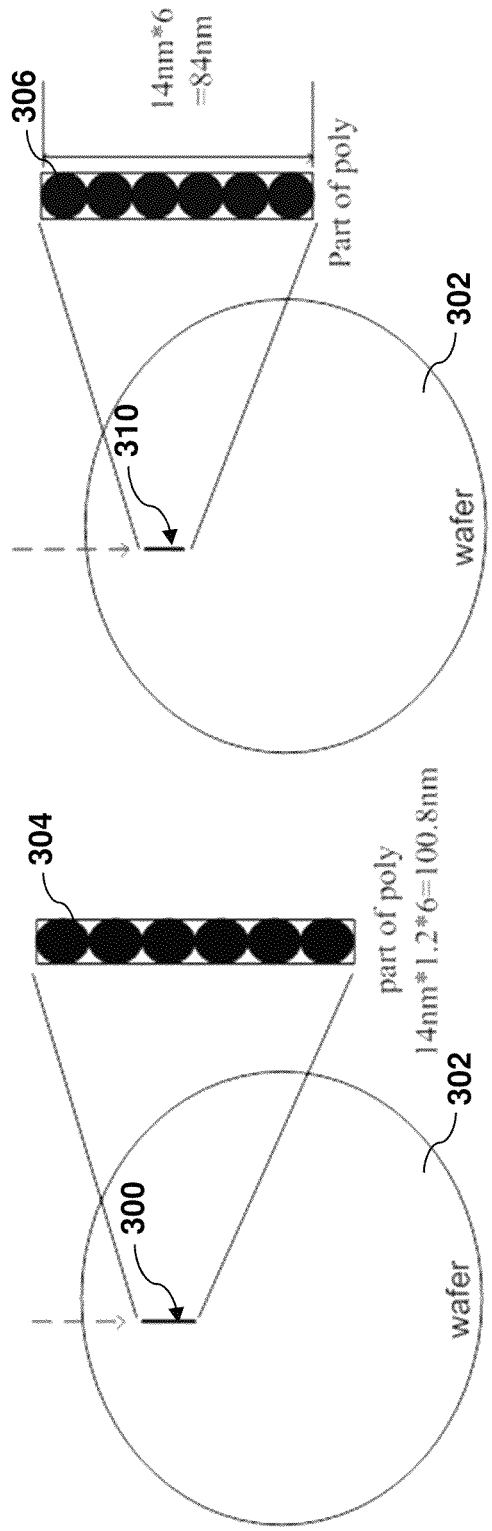
FIGS. 3A and 3B are illustrations showing increased throughput according to one or more embodiments.

Referring to FIG. 3A, a rectangular feature 300 (e.g., a part of polysilicon) is exposed on a wafer 302. In this example, the feature 300 is exposed using the a group of lens lets 304 each having a first dimension y that is 20% larger than a second dimension x. In this example, six electron beams or pixels 304 having x as 14 nm and y as 16.8 nm can expose 100.8 nm (14*1.2*6=100.8) in the y direction on the wafer 302.

Referring to FIG. 3B, another rectangular feature 310 is exposed on the wafer 302. In this example, the feature 310 is exposed using the a group of lens lets 306 each having a first dimension y the same as a second dimension x. In this example, six electron beams or pixels 304 having x as 14 nm and y as 14 nm can expose 84 nm (14*6=84) in the y direction on the wafer 302.

Figure 4B:
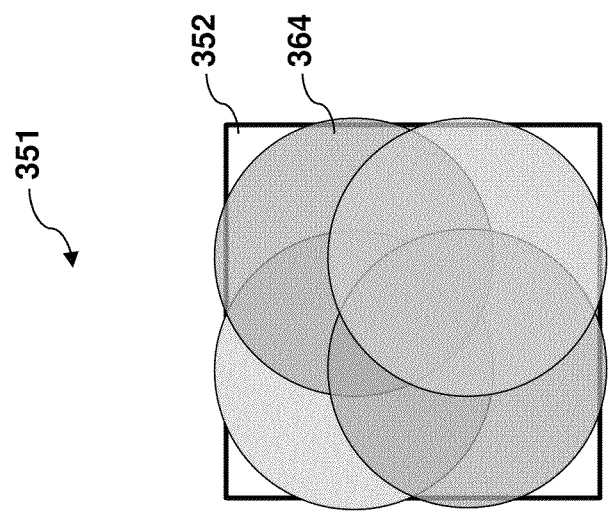
FIGS. 4A and 4B are illustrations showing increased throughput according to one or more embodiments.
Figure 4A:
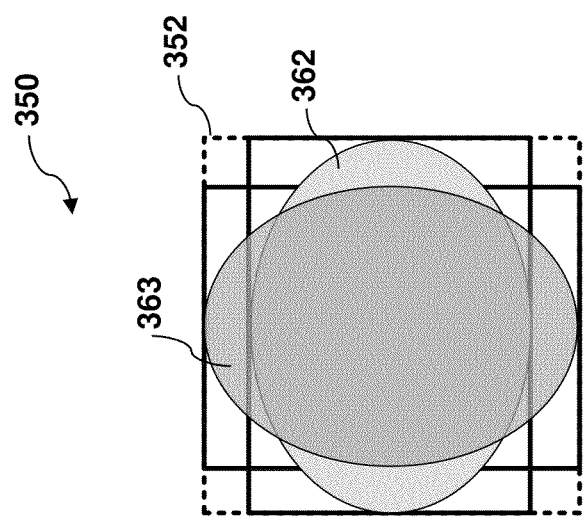

Referring to FIG. 4A, an example 350 using lens lets having different first and second dimensions are used to write a square feature 352. In the example 350, a lens let having a first dimension y larger than a second dimension x generates an electron pixel 362. Either the substrate or the lens let can be rotated orthogonally or 90 degrees so that the lens let generates an electron pixel 363. Thus, the square feature 352 is written with two exposures.

Referring to FIG. 4B, in another example 351, a lens let having equal first and second dimensions is used to write the square feature 352. In this example, four different pixels (having the same shape, but being offset from each other as illustrated) are used to write the square feature 352. Therefore, the throughput in example 350 is twice that of example 351. Further, the illumination (one overlay of two pixels) as shown in FIG. 4A is more uniform than the illumination (one overlap of four pixels, four overlap of three pixels, and four overlaps of 2 pixels) as shown in FIG. 4B.

Figure 5:
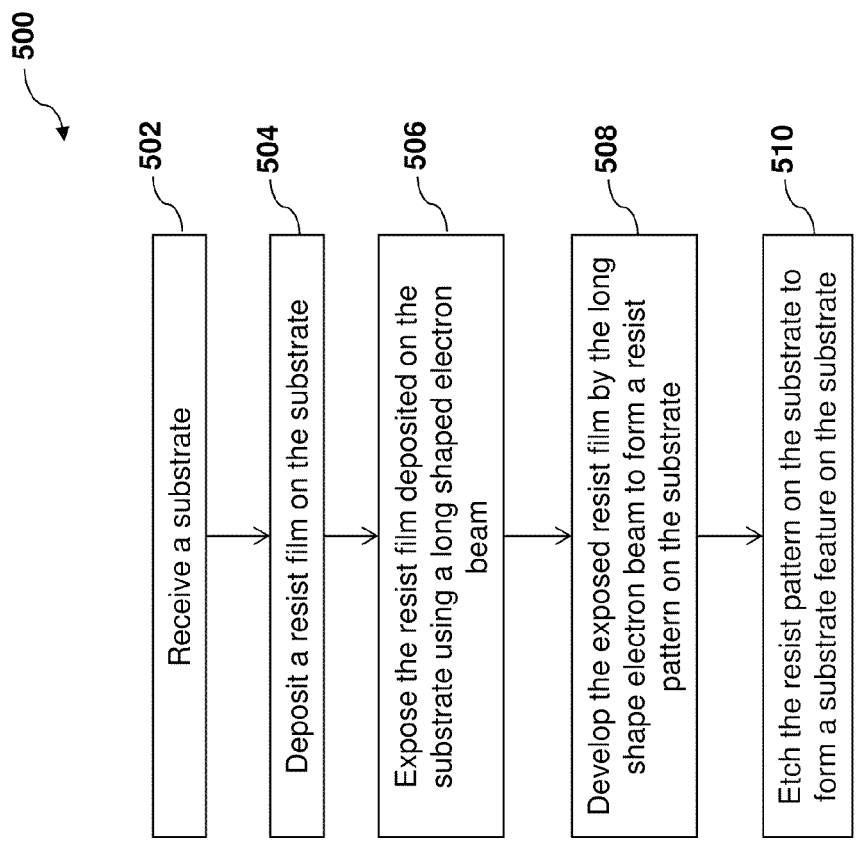
FIG. 5 is a flow chart of a method of forming a feature on a substrate according to one or more embodiments.
Figure 8:
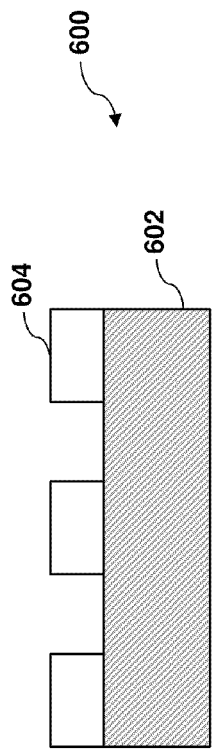
Figure 11:
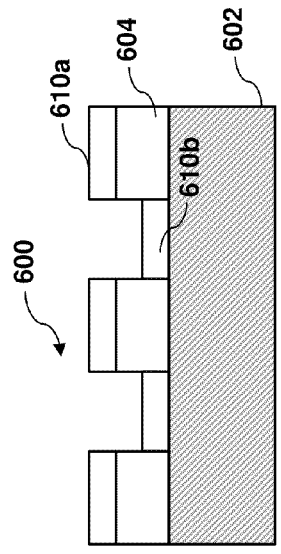
Figure 12:
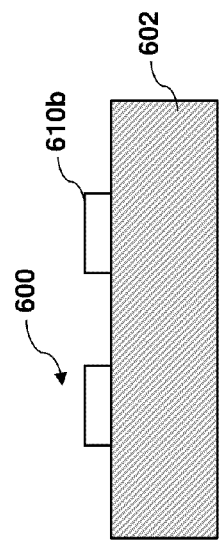
Figure 9:
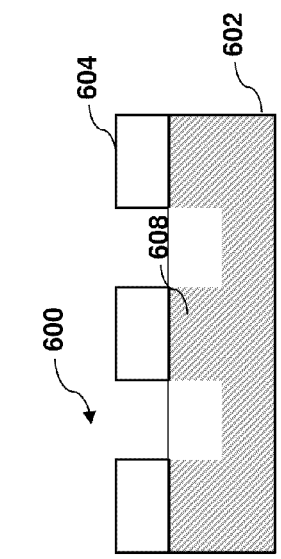
Figure 10:
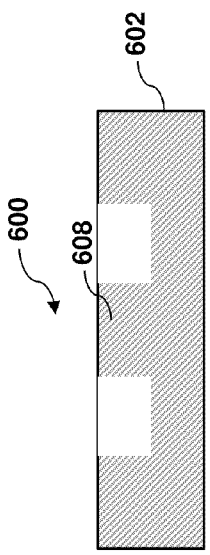

Referring to FIG. 5, a flow chart of a method 500 for fabricating a structure using the system 100 is illustrated. FIGS. 6-12 are cross sectional views of a structure 600 using the method 500 according to one or more embodiments. It is understood that additional steps can be provided before, during, and after the method 500, and some the steps described can be replaced, eliminated, or moved around for additional embodiments of the method. The method 500 is an example, and is not intended to limit the present invention beyond what is explicitly recited in the claims.

The method 500 begins at step 502 by receiving or providing a substrate. In some embodiments, the substrate may include a wafer, such as a silicon wafer. Alternatively or additionally, the substrate includes another elementary semiconductor, such as germanium; a compound semiconductor including silicon carbide, gallium arsenic, gallium phosphide, indium phosphide, indium arsenide, and/or indium antimonide; or an alloy semiconductor including SiGe, GaAsP, AlInAs, AlGaAs, GaInAs, GaInP, and/or GaInAsP. In yet another alternative, the wafer substrate includes a semiconductor on insulator (SOI) structure. In other embodiments, the wafer substrate also includes one or more conductive and/or dielectric films. In the present embodiment, the dielectric film may include silicon oxide, high k dielectric material film, or a combination of silicon oxide and high k dielectric material, and the conductive thin film for the gate electrode film may include doped polysilicon, or a metal, such as aluminum (Al), copper (Cu), tungsten (W), nickel (Ni), titanium (Ti), gold (Au), platinum (Pt) or alloy of the metals thereof.

In some embodiments, the substrate may include a mask blanket for making a photomask. A mask blanket may include a low thermal expansion and high transparent material, such as a quartz. A mask may also include an opaque material, such as chromium (Cr) or silicon molybdenum (MoSi). A mask may be a transmittance mask, such as a binary mask (BIM), or a phase shift mask (PSM), which includes an alternative phase shift mask (alt. PSM) or an attenuated phase shift mask (att. PSM). A mask may be a reflective mask. The mask cab be used in an optical lithography tool, such as an I-line, a deep ultraviolet (DUV), or an extreme ultraviolet (EUV) tool.

The method 500 proceeds to step 504 by depositing a resist film on the substrate. In the present embodiment, a resist film is also referred to as resist or photoresist. The resist film may be a positive resist or a negative resist, and may include a single layer or a multiple layers of resist. One way of depositing a resist film on the substrate is using a coating process, for example a spin-on process. In the present example, depositing a resist film includes performing a dehydration process before applying the resist on the substrate, which can enhance an adhesion of the resist film to the wafer substrate. The dehydration process may include baking the substrate at a high temperature for a duration of time, or applying a chemical such as hexamethyldisilizane (HMDS) to the substrate. Depositing a resist film may also include a soft bake (SB) process to drive a solvent out of a resist film and increase mechanical strength of a resist film. Depositing a resist film may include applying an antireflective coating, such as a bottom antireflective coating (BARC) or a top antireflective coating (TARC). With reference to the example of FIG. 6, a resist film 604 is deposited on a substrate 602.

The method 500 proceeds to step 506 by exposing the resist film deposited on the substrate according to an IC design layout using the lithography system 100, generating a long shaped radiation beam or pixel as shown in FIG. 3A. In the present embodiment, a long shaped radiation beam includes the first dimension y larger than the second dimension x. In one embodiment, exposing the resist film includes converting the IC design layout to an electron beam format data. With reference to the example of FIG. 7, a long shaped electron beam 606 exposes the resist film 604 deposited on the substrate 602.

The method 500 proceeds to step 508 by applying a developer on an exposed resist film deposited on a substrate to form a resist pattern on the substrate. In one embodiment, a developer includes a water based developer, such as tetramethylammonium hydroxide (TMAH), for a positive tone development (PTD). In another embodiment, a developer may include an organic solvent or a mixture of organic solvents, such as methyl a-amyl ketone (MAK) or a mixture involving the MAK, for a negative tome development (NTD). Applying a developer includes spraying a developer on the exposed resist film, for example by a spin-on process. Applying a developer also include using a post exposure bake (PEB), a post develop bake (PDB) process, or a combination thereof. With reference to the example of FIG. 8, the patterned resist film 604 is formed on the substrate 602.

The method 500 proceeds to step 510 by transferring the resist pattern to the substrate. In some embodiments, transferring the resist pattern to the substrate includes performing an etching process on the resist pattern, removing the resist, and forming a substrate pattern or feature on the substrate. The etching process may include a dry (plasma) etching, a wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. The etching process may further include using a cleaning process. With reference to the examples of FIGS. 9 and 10, a substrate pattern 608 is formed on the substrate 602.

In other embodiments, transferring a resist pattern to the substrate includes depositing a film, such as a metal film, over the resist pattern and the substrate, performing a lift-off process to remove the film deposited over the resist pattern, and forming a film pattern on the substrate. In one embodiment, a lift-off process includes using a deposition process, such as a physical vapor deposition (PVD), or a sputtering process. In another embodiment, a lift-off process also includes using a tape. In an alternative embodiment, a lift-off process further includes using a cleaning process. With reference to the example of FIG. 11, a film 610a and 610b is deposited over the resist pattern 604 and the substrate 602, respectively. With reference to the example of FIG. 12, after the lift-off process, the patterned film 610b is formed on the substrate 602.

Thus, the present disclosure describes a lithography system of exposing a resist film deposited on a substrate. The system includes an integrated circuit (IC) design data base having a feature, a source configured to generate a radiation beam, a pattern generator (PG) including a mirror array plate and an electrode plate disposed over the mirror array plate, wherein the electrode plate includes a lens let having a first dimension and a second dimension perpendicular to the first dimension with the first dimension larger than the second dimension so that the lens let modifies the radiation beam to form the long shaped radiation beam, and a stage configured secured the substrate. The system further includes an electric field generator connecting the mirror array plate. The mirror array plate includes a mirror. The mirror absorbs or reflects the radiation beam. The radiation beam includes electron beam or ion beam. The second dimension is equal to a minimum dimension of the feature.

In some embodiments, a pattern generator is presented. The pattern generator includes a mirror array plate including a mirror, an electrode plate configured to disposed over the mirror array plate, wherein the electrode plate includes a lens let having a first dimension and a second dimension perpendicular to the first dimension with the first dimension larger than the second dimension, and an insulator layer sandwiched between the mirror array plate and the electrode plate. The mirror is connected to an electric field generator controlled by an integrated circuit (IC) design layout having a feature. The mirror absorbs or reflects a radiation beam according to the IC design layout. The electrode plate is configured to parallel to the mirror array plate. The electrode plate includes a metal or metal alloy. The lens let is configured to align to the mirror.

In one or more embodiments, a method for fabricating a feature on a substrate is described. The method include receiving a substrate, depositing a resist film on the substrate, exposing the resist film using a radiation beam according to the feature, wherein the radiation beam includes a first dimension and second dimension perpendicular to the first dimension with the first dimension larger than the second dimension, and developing the exposed resist film to form a resist pattern on the substrate. The method further includes transferring the resist pattern to the substrate. Transferring the resist pattern includes using an etching process. Transferring the resist pattern includes using a liftoff process. The substrate includes a wafer or a mask blanket. The mask blanket includes an opaque layer for a transmittance mask. The mask blanket includes a reflective layer for a reflective mask. The radiation beam includes an ion beam or an electron beam.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An exposure system comprising:
   a source configured to generate a first radiation beam; and
   a pattern generator (PG) including:
      a mirror array plate configured to receive the first radiation beam and generate a second radiation beam, wherein the second radiation beam includes a set of radiation beam lets including a first radiation beam let; and
      an electrode plate disposed over the mirror array plate, wherein the electrode plate includes a lens let, wherein the lens let has an aperture having a first dimension and a second dimension perpendicular to the first dimension with the first dimension being larger than the second dimension, and wherein the aperture is configured to shape the first radiation beam let to expose an elongated pixel on a substrate.

2. The system of claim 1, further comprising
   an integrated circuit (IC) design database having an IC design layout having a minimum feature; and
   an electric field generator connected to the PG for controlling the mirror array plate in response to the IC design layout.

3. The system of claim 2, wherein the second dimension is equal to a dimension of the minimum feature.

4. The system of claim 1, wherein the mirror array plate includes a mirror.

5. The system of claim 4, wherein the mirror is configured to reflect the radiation beam to generate the first radiation beam let.

6. The system of claim 1, wherein the radiation beam includes an electron beam.

7. A pattern generator (PG) comprising:
   a mirror array plate including a plurality of mirrors an electrode plate disposed over the mirror array plate, wherein the electrode plate includes a plurality of lens lets, wherein each lens let has an aperture having a first dimension and a second dimension perpendicular to the first dimension with the first dimension being larger than the second dimension, wherein the aperture is configured to shape a radiation beam let passing through the aperture to have an elongated cross-section corresponding to the shape of the aperture; and
   an insulator layer sandwiched between the mirror array plate and the electrode plate.

8. The pattern generator of claim 7, wherein each mirror is connected to an electric field generator controlled according to an integrated circuit (IC) design layout having a minimum feature.

9. The pattern generator of claim 8, wherein the mirror array plate receives a radiation beam, and wherein each mirror absorbs or reflects the radiation beam according to the IC design layout.

10. The pattern generator of claim 7, wherein the electrode plate is parallel to the mirror array plate.

11. The pattern generator of claim 7, wherein the electrode plate includes a metal or metal alloy.

12. The pattern generator of claim 7, wherein each lens let of the plurality of lens lets aligns to a corresponding mirror of the plurality of mirrors.

13. A pattern generator system, comprising:
   a mirror array plate configured to receive a radiation beam, wherein the mirror array plate includes a set of mirrors, wherein each mirror is configured to absorb the radiation beam or to reflect the radiation beam to generate a radiation beam let; and
   a lens let array disposed over the mirror array plate, wherein the lens let array includes a set of lens let channels, wherein each lens let channel extends from a top opening to a bottom opening, wherein the bottom opening aligns with a corresponding mirror, wherein the top opening has an elongated shape with a length and a width perpendicular to the length, wherein the length is greater than the width, and wherein the top opening is configured to shape the radiation beam let generated by the corresponding mirror to project an elongated illumination pixel.

14. The pattern generator system of claim 13, further comprising:
   an electrode plate disposed over the mirror array plate, wherein at least a first portion of a sidewall of each lens let channel is formed in the electrode plate, and wherein the electrode plate is connected to an electric field source.

15. The pattern generator system of claim 14, further comprising:
   an insulator layer sandwiched between the mirror array plate and the electrode plate, wherein at least a second portion of the sidewall of each lens let channel is formed in the insulator layer.

16. The pattern generator system of claim 14, wherein the electrode plate includes a metal or metal alloy.

17. The pattern generator system of claim 13, further comprising:
   an integrated circuit (IC) design database having a pattern; and
   an electric field generator connected to the mirror array plate and configured to select a first set of mirrors to reflect the radiation beam according to the elongated shape of the first openings and the pattern.

18. The pattern generator system of claim 13, wherein the radiation beam includes an electron beam.

19. The pattern generator system of claim 13, wherein the width of the elongated shape is equal to a minimum feature size of the pattern.

20. The pattern generator system of claim 13, wherein the elongated shape is an ellipse.

\* \* \* \* \*